United States Patent
Tao et al.

(10) Patent No.: US 12,557,246 B2
(45) Date of Patent: Feb. 17, 2026

(54) HEAT DISSIPATION APPARATUS AND ELECTRONIC DEVICE

(71) Applicant: BESTAR Holdings Co., Ltd., Changzhou (CN)

(72) Inventors: Hongzhong Tao, Changzhou (CN); Xiyue He, Changzhou (CN); Yifei Wu, Changzhou (CN)

(73) Assignee: BESTAR Holdings Co., Ltd., Changzhou (CN)

( * ) Notice: Subject to any disclaimer, the term of this patent is extended or adjusted under 35 U.S.C. 154(b) by 0 days.

(21) Appl. No.: 19/202,295

(22) Filed: May 8, 2025

(65) Prior Publication Data

US 2025/0275094 A1    Aug. 28, 2025

Related U.S. Application Data

(63) Continuation of application No. PCT/CN2024/088017, filed on Apr. 16, 2024.

(30) Foreign Application Priority Data

Aug. 24, 2023 (CN) .......................... 202311070200.X

(51) Int. Cl.
    *H05K 7/20* (2006.01)
(52) U.S. Cl.
    CPC ..... *H05K 7/20327* (2013.01); *H05K 7/20336* (2013.01); *H05K 7/20381* (2013.01)
(58) Field of Classification Search
    CPC ...... F28D 1/0341; F28D 1/035; F28D 1/0383; F28F 13/08; F28F 3/12
    See application file for complete search history.

(56) References Cited

U.S. PATENT DOCUMENTS

| | | | | |
|---|---|---|---|---|
| 2020/0029466 A1* | 1/2020 | Long | .................. | H05K 7/20309 |
| 2022/0285759 A1* | 9/2022 | Kim | .................. | H01M 10/6567 |

FOREIGN PATENT DOCUMENTS

| | | | | | |
|---|---|---|---|---|---|
| CN | 209993695 U | | 1/2020 | | |
| CN | 212910536 U | | 4/2021 | | |
| CN | 110418550 B | * | 6/2021 | ......... | H05K 7/20336 |
| CN | 215582373 U | * | 1/2022 | | |
| CN | 215773979 U | | 2/2022 | | |
| CN | 216058031 U | | 3/2022 | | |
| JP | 2007043041 A | | 2/2007 | | |

* cited by examiner

*Primary Examiner* — Jianying C Atkisson
*Assistant Examiner* — Khaled Ahmed Ali Al Samiri
(74) *Attorney, Agent, or Firm* — Nitin Kaushik

(57) ABSTRACT

The present invention relates to the technical field of heat dissipation for electronic devices, and in particular to a heat dissipation apparatus and an electronic device. The apparatus comprises: at least one power pump with an inlet and outlet for circulating cooling medium; and a vapor chamber containing a flow channel connecting the outlet and inlet to form a closed loop. The flow channel includes a slow-flow region away from the heat source with larger cross-section for rapid heat dissipation, and a fast-flow region near the heat source with smaller cross-section for quick heat absorption. This design achieves precise heat dissipation and improves efficiency. The invention also claims electronic devices incorporating this apparatus.

7 Claims, 10 Drawing Sheets

HEAT DISSIPATION APPARATUS AND ELECTRONIC DEVICE

CROSS-REFERENCE TO RELATED APPLICATIONS

The application claims priority to Chinese patent application No. 202311070200X, filed on Aug. 24, 2023, the entire contents of which are incorporated herein by reference.

TECHNICAL FIELD

The present invention relates to the technical field of heat dissipation for electronic devices, and in particular to a heat dissipation apparatus and an electronic device.

BACKGROUND

Electronic devices, in particular portable electronic devices such as mobile phones and laptops, generate immense heat during operation, in which case long-term high temperature is likely to result in unstable system operation, significantly reduced experience, as well as seriously compromised operation performance and service life of core components such as system chips.

In traditional technologies, for example, air cooling or cooling fins are often used in notebook computers to address heat dissipation. For example, a fan is installed in a notebook computer to accelerate air circulation through the rotation of the fan, reducing the surface temperature of heating components in the notebook computer. However, the arranged the fan increases the thickness of the notebook computer, and is also likely to cause problems such as noise and dust. Furthermore, with the increasing market demand for lightweight, thin and foldable electronic products, traditional cooling fins can no longer meet the current heat dissipation requirements of electronic products due to their low heat dissipation efficiency and susceptibility to damage during folding, even though they will not increase the thickness of the product.

In the prior art, in order to solve the above problems, a foldable liquid-cooled patch heat dissipation structure driven by a piezoelectric pump is adopted. For example, a Chinese patent for utility model with Authorization Announcement Number CN 212910536U discloses on Apr. 6, 2021 a liquid-cooled heat dissipation module and an electronic device, where a heat dissipation circuit is formed by the connection of a power pump and a flow channel, and a patch structure is provided to reduce the thickness of a product and achieve foldability. However, the inventor has found that heat sources in electronic devices such as mobile phones and notebook computers are usually concentrated, in which case there is no difference in the heat dissipation effect of the above heat-dissipating flow channel at each place on a soaking plate, such that a waste of heat dissipation efficiency is caused to a certain extent.

SUMMARY

In view of at least one of the above technical problems, the present invention provides a heat dissipation apparatus and an electronic device, to achieve precise heat dissipation by means of structural improvement.

According to a first aspect of the present invention, a heat dissipation apparatus is provided. The heat dissipation apparatus includes:

at least one power pump having an input and an outlet, a cooling medium flowing into the inlet and being delivered by the power pump through the outlet; and a heat-dissipating vapor chamber provided with a flow channel therein, both ends of the flow channel being communicated to the outlet and the inlet, respectively, to form a circulating cooling path;

wherein the flow channel has a slow flow region which is away from the heat source and in which the cooling medium has a lower flow rate, the slow flow region is used to dissipate heat rapidly, the flow channel has a rapid flow region which is close to the heat source and in which the cooling medium has a higher flow rate, and the rapid flow region is used to rapidly absorb and take away heat; a cross-sectional area of the flow channel at the slow flow region is greater than a cross-sectional area of the flow channel at the rapid flow region.

In some embodiments of the present invention, the flow channel is in a dual-channel form, and the cooling medium is divided into two back flows after passing the heat source.

In some embodiments of the present invention, a back flow portion of the slow flow region is further connected to a laminar flow section, which has a cross-sectional area greater than the cross-sectional area of the flow channel in the slow flow region.

In some embodiments of the present invention, the laminar flow section is provided with shunting strips therein.

In some embodiments of the present invention, the flow channel has dividing strips in the rapid flow region along a flow direction of the cooling medium.

In some embodiments of the present invention, the flow channel is tortuously arranged in the rapid flow region, and an arc flow guiding strip is further connected between two dividing strips between two adjacent tortuous channels.

In some embodiments of the present invention, a portion of the slow flow region extending from the rapid flow region further includes a tortuous channel.

In some embodiments of the present invention, the flow channel passes the heat source only once in a single circulation, the cooling medium flows from an end of the flow channel away from the heat source to the rapid flow region, and after flowing out of the rapid flow region, the cooling medium first flows to the distant end and then flows back to form a circulation.

In some embodiments of the present invention, the flow channel is configured to enable the cooling medium to first tortuously flow to get close to the rapid flow region and then flow back to the rapid flow region to form a circulation, after the cooling medium flows out from the rapid flow region to a distant end.

In some embodiments of the present invention, the heat-dissipating vapor chamber is made of a flexible material, and is provided with buffering through holes in a folded region and around the flow channel.

In some embodiments of the present invention, the heat-dissipating vapor chamber sequentially includes an upper region, a middle region and a lower region in a thickness direction thereof, the flow channel is disposed on the middle region, the middle region includes at least one layer of thin-film material, and the upper region and the lower region are used to seal the cooling medium in the middle region and are each made of a metallic thin sheet or a thin-film material.

In some embodiments of the present invention, the thin-film material is made of graphene, polytetrafluoroethylene, modified PI, PEN or PET, and the metallic thin sheet is made of a steel foil, aluminum foil or a copper foil.

In some embodiments of the present invention, the power pump is a piezoelectric pump, which has a power configured to allow for driving at a higher power when a temperature of the heat source is greater than or equal to a set value, and driving at a lower power when the temperature of the heat source is smaller than the set value.

According to a second aspect of the present invention, an electronic device is further provided. The electronic device includes:

a heating component; and the heat dissipation apparatus according to any one in the first aspect.

The beneficial effects of the present invention are as follows: according to the present invention, the cooling medium is circulated in the flow channel of the heat-dissipating vapor chamber by means of the power pump, the rapid flow region with a high flow rate is formed on the portion of the heat-dissipating vapor chamber close to the heat source to rapidly absorb and take away heat, and the slow flow region with a low flow rate is formed on the end of the heat-dissipating vapor chamber away from the heat source to dissipate heat for the cooling medium as soon as possible. Compared with the prior art, the heat source is given the priority of heat dissipation in key regions through the improvement of flow path, and the effect of precise heat dissipation is then achieved.

BRIEF DESCRIPTION OF DRAWINGS

To describe the technical solutions in the embodiments of the present invention or in the prior art more clearly, the following briefly introduces the accompanying drawings to be used in the description of the embodiments or the prior art. Obviously, the accompanying drawings in the following description show merely some embodiments stated in the present invention, and a person of ordinary skill in the art may still derive other drawings from these accompanying drawings without creative efforts.

DETAILED DESCRIPTION OF THE EMBODIMENTS

The technical solutions in the embodiments of the present invention will be described clearly and completely below in conjunction with the accompanying drawings in the embodiments of the present invention. Obviously, the embodiments described are merely some instead of all of the embodiments of the present invention.

It should be noted that when an element is referred to as being "fixed to" another element, said element may be directly disposed on said another element, or there may be an intermediate element therebetween. When an element is referred to as being "connected to" another element, said element may be directly attached to said another element, or there may be an intermediate element therebetween at the same time. The terms "perpendicular", "horizontal", "left", "right" and similar expressions as used herein are for an illustrative purpose, instead of indicating a unique implementation.

Unless otherwise defined, all technical and scientific terms as used herein have the same meanings as those commonly understood by those skilled in the art of the present invention. The terms used in the specification of the present invention are only for the purpose of describing specific embodiments, and are not intended to limit the present invention. The term "and/or" as used herein includes any and all combinations of one or more relevant listed items.

Embodiment I

Figure 1:
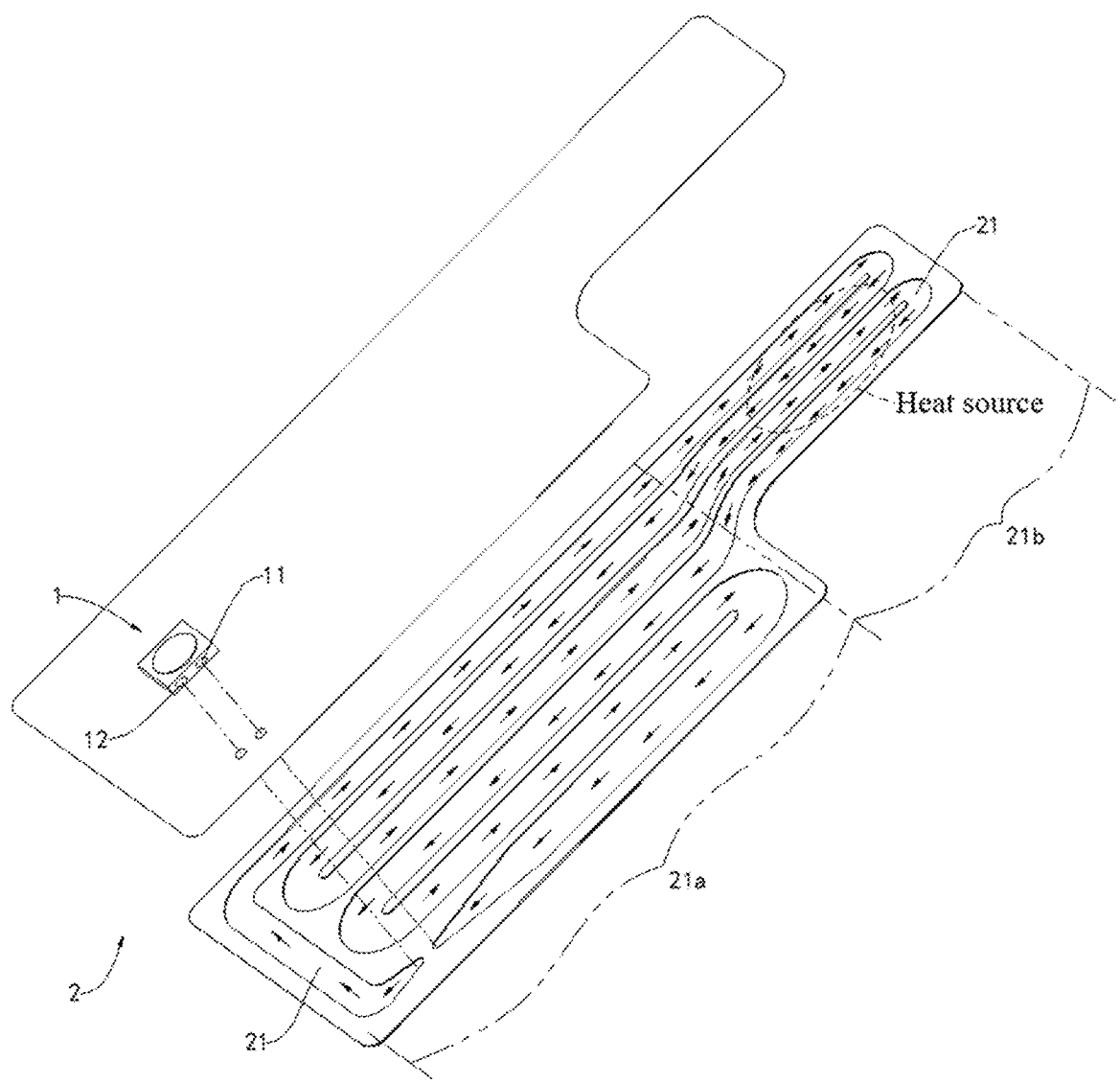
FIG. 1 shows a schematic structural diagram of a heat dissipation apparatus according to Embodiment I of the present invention.

As shown in FIG. 1, the heat dissipation apparatus includes a power pump 1 and a heat-dissipating vapor chamber 2.

In this embodiment of the present invention, there is at least one power pump 1, which has an input 11 and an outlet 12, and a cooling medium flows into the inlet 11 and is delivered out from the outlet 12 by the power pump 1. In this embodiment of the present invention, the power pump 1 may be a piezoelectric pump, which is known in prior art and based on the following working principle: when an alternating-current power supply is applied to both ends of a piezoelectric vibrator, the piezoelectric vibrator is radially compressed under the action of an electric field to produce a tensile stress inside, resulting in bending and deformation of the piezoelectric vibrator. When bent in a forward direction, the piezoelectric vibrator is elongated, the volume of a pump chamber is increased to reduce the pressure on a fluid in the chamber, a pump valve is opened to allow a liquid to enter the pump chamber; and when bent in a reverse direction, the piezoelectric vibrator is contracted, the volume of the pump chamber is reduced to increase the pressure on the fluid in the camber, and the pump valve is closed to extrude and discharge the liquid from the pump chamber, such that a smooth, continuous and directional flow is formed. It should be noted here that, in some embodiments of the present invention, the number of the piezoelectric pump may be set to one or more as desired, and the number of the inlet 11 or outlet 12 of the power pump 1 may also be set to one or more as desired.

Continuing to refer to FIG. 1, in this embodiment of the present invention, the heat-dissipating vapor chamber 2 is provided with a flow channel 21 therein, both ends of the flow channel 21 are communicated to the outlet 12 and the inlet 11, respectively, to form a circulating cooling path. It should be noted here that, in this embodiment of the present invention, the flow channel 21 may be arranged in the heat-dissipating vapor chamber 2 in a variety of forms. The flow channel may be formed by laminating plates, or in the middle of three laminated plates, or by a groove disposed in a lower layer of two flexible plates, or by folding and molding a single flexible plate, and so on. The material of the plate will be introduced in detail below in the embodiments of the present invention.

Continuing to refer to FIG. 1, in this embodiment of the present invention, the flow channel 21 has a slow flow region 21a which is away from the heat source (e.g. heating component) and in which the cooling medium has a lower flow rate, the slow flow region 21a is used to dissipate heat rapidly, the flow channel 21 has a rapid flow region 21b which is close to the heat source and in which the cooling medium has a higher flow rate, and the rapid flow region 21b is used to rapidly absorb and take away heat. It should be noted here that, in this embodiment of the present invention, the flow rate of the cooling medium in the flow channel may be controlled in a variety of ways. For example, the width or depth of the flow channel 21 may be changed, as long as the cross-sectional area of the flow channel 21 in the slow flow region 21a is greater than that of the flow channel in the rapid flow region 21b. Here, the cross-sectional area of the flow channel 21 refers to the effective area occupied by the cooling medium when the cooling medium flows through the flow channel 21. In this embodiment of the present invention, as shown in FIG. 1, the width of the flow channel 21 is increased in the slow flow region 21a and decreased in the rapid flow region 21b, such that the cooling medium flows at a lower flow rate in the slow flow region 21a and at a higher flow rate in the rapid flow region 21b. As shown in FIG. 1, in this embodiment of the present invention, the region where the rapid flow region 21b of the heat-dissipating vapor chamber 2 is located is attached to the heat source of an electronic component; the heat of the heat source is transmitted to the rapid flow region 21b by heat conduction, and then can be rapidly taken away since the flow rate in the rapid flow region 21b is high; after the cooling medium flows from the rapid flow region 21b to the slow flow region 21a, its flow rate is reduced; and at this point, the heat in the cooling medium can be rapidly dissipated by means of slow flowing. It should be noted here that, in some embodiments of the present invention, the cooling medium may be liquid or gaseous, which is not limited here. In addition, it should also be noted here that, in this embodiment of the present invention, the number of times that the cooling medium flows through the heat source in the rapid flow region 21b is not limited, and the cooling medium may flow through the heat source multiple times as shown in FIG. 1.

In the above embodiment, the cooling medium is circulated in the flow channel 21 of the heat-dissipating vapor chamber 2 by means of the power pump 1, the rapid flow region 21b with a high flow rate is formed on the portion of the heat-dissipating vapor chamber 2 close to the heat source to rapidly absorb and take away heat, and the slow flow region 21a with a low flow rate is formed on the end of the heat-dissipating vapor chamber away from the heat source to dissipate heat for the cooling medium as soon as possible. Compared with the prior art, the heat source is given the priority of heat dissipation in key regions through the improvement of flow path, and the effect of precise heat dissipation is then achieved.

Figure 2:
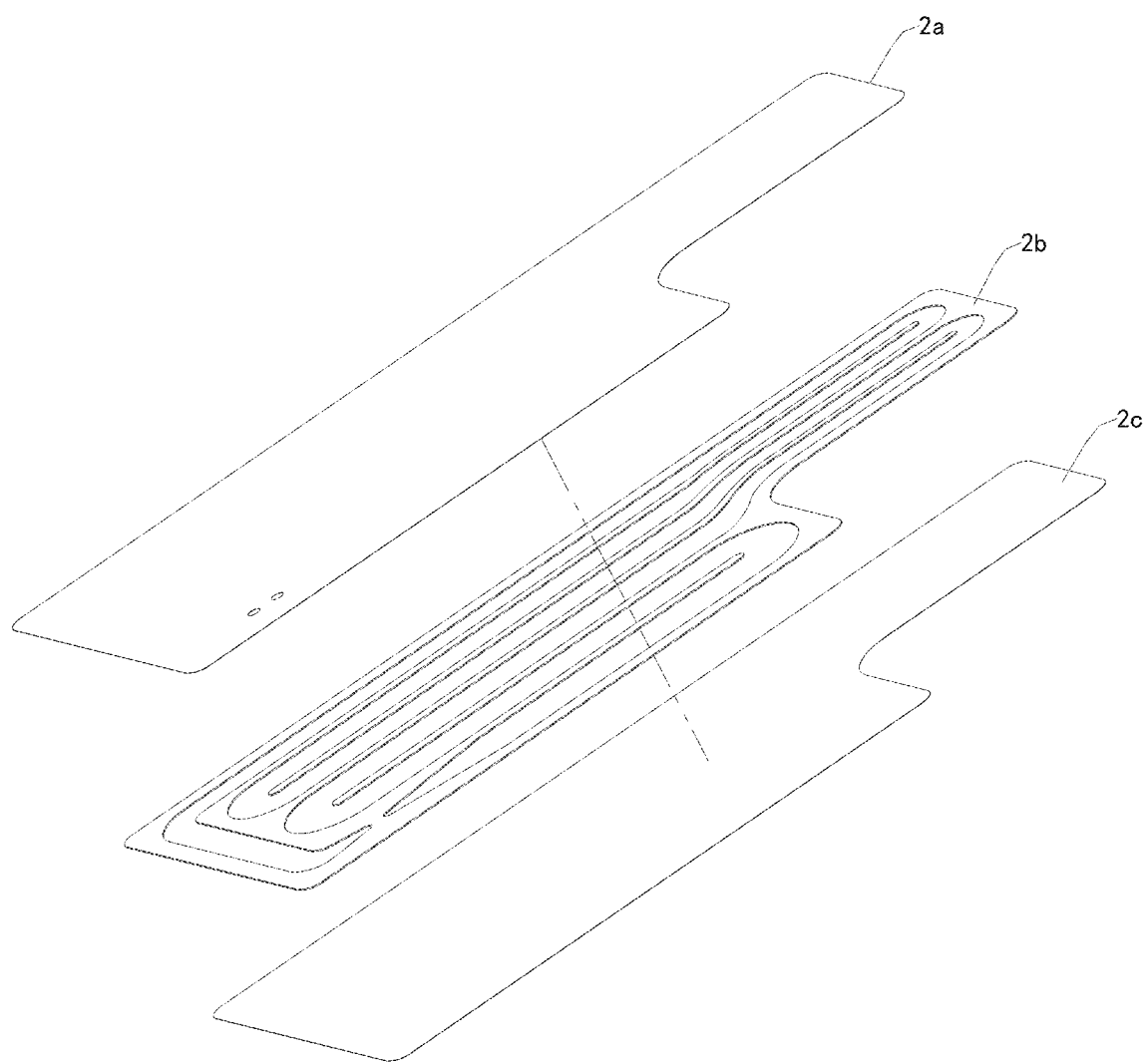
FIG. 2 shows a schematic exploded structural diagram of a heat-dissipating vapor chamber according to Embodiment I of the present invention.

Based on the above embodiment, in this embodiment of the present invention, the specific structure of the heat-dissipating vapor chamber 2 is shown in FIG. 2. The heat-dissipating vapor chamber 2 sequentially includes an upper region 2a, a middle region 2b and a lower region 2c in a thickness direction thereof, the flow channel 21 is disposed on the middle region 2b, the middle region 2b includes at least one layer of thin-film material, and the upper region 2a and the lower region 2c are used to seal the cooling medium in the middle region 2b and are each made of a metallic thin sheet or a thin-film material. In this embodiment of the present invention, the upper region 2a, the middle region 2b and the lower region 2c are intended to describe the structural layers of the heat-dissipating vapor chamber 2. In this embodiment of the present invention, the middle region 2b is a molding region of the flow region 21, and is mostly made of a single layer of thin-film material with low or no water absorption; during heat dissipation, when the cooling medium is a cooling fluid, of the upper region 2a and the lower region 2c are used to prevent leakage and volatilization of the cooling fluid. In this embodiment of the present invention, the thin-film material is made of, but not limited to, graphene, polytetrafluoroethylene, modified PI, PEN or PET, and the metallic thin sheet is made of, but not limited to, a steel foil, aluminum foil or a copper foil. It should be noted here that the number of layers of the thin-film material or the metallic thin sheet is not limited to one. In case of a metallic thin sheet, a metal surface has a risk of rust due to its long-term contact with the cooling fluid and air. In this embodiment of the present invention, the metallic thin sheet may be further subjected to rust-proof treatment, for example, by single-side or double-side film application.

Figure 3:
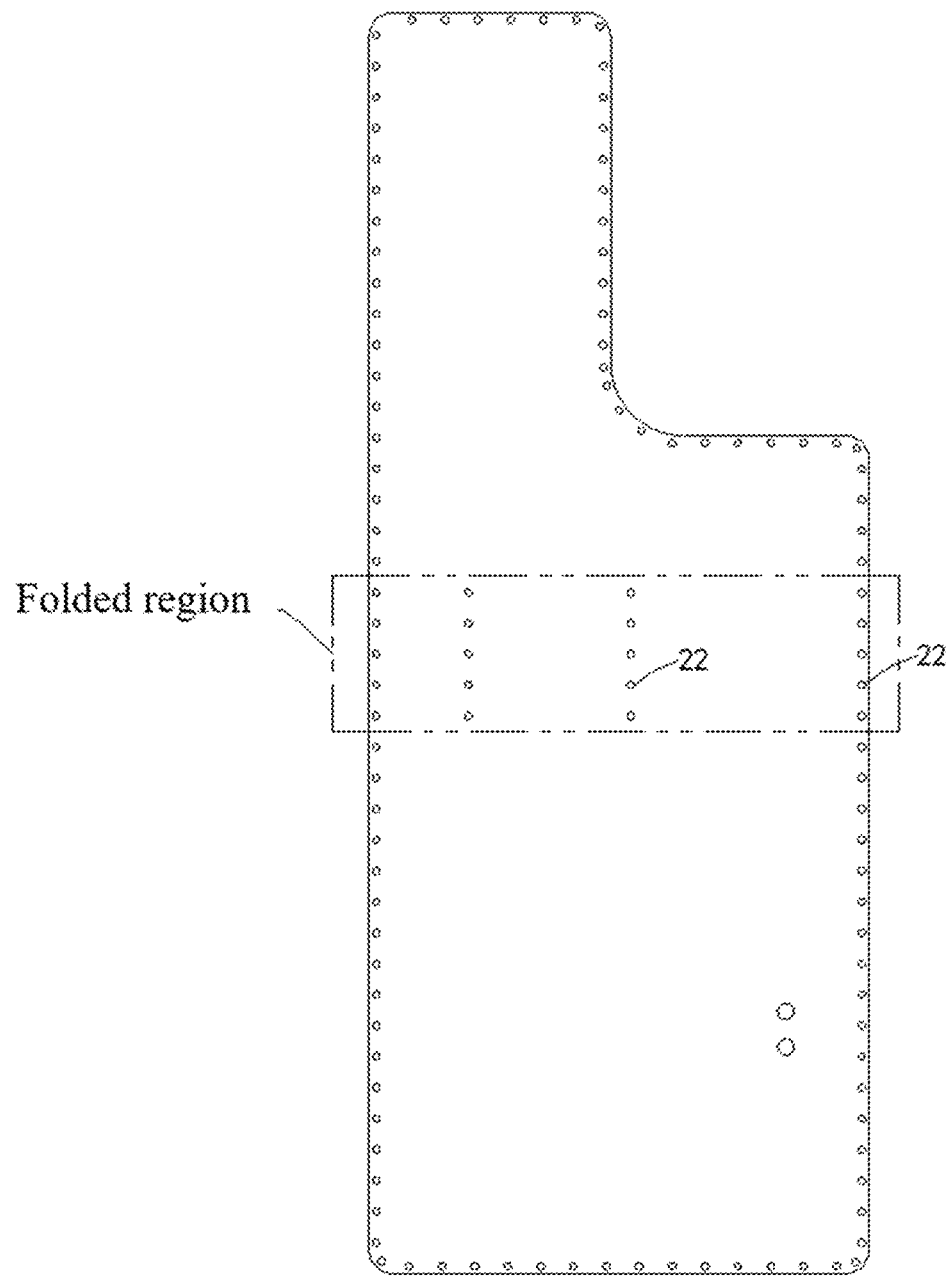
FIG. 3 shows a schematic diagram of a perforated structure of buffering holes in the heat-dissipating vapor chamber according to Embodiment I of the present invention.

In this embodiment of the present invention, the heat-dissipating vapor chamber 2 is made of a foldable flexible material. In order to improvement the foldability and service life of the heat-dissipating vapor chamber 2, as shown in FIG. 3, the heat-dissipating vapor chamber 2 is provided with buffering through holes 22 in a folded region and around the flow channel 21. Here, the buffering through holes 22 are not in contact with the flow channel 21 and serve to reduce the stress impact to the folded region, avoiding stress overload for the folded region. Moreover, the arrangement of the buffering through holes 22 can resist the expansive deformation of the heat-dissipating vapor chamber 2 to some extent after temperature rise, which in turn reduces the overall deformation. It should also be noted here that, in the above embodiment, when the metallic thin film is used with a total number of layers not less than 4 layers, a bending region should be evaded by the coverage of the metallic thin film. With the above arrangement, the normal function of the metallic thin film is ensured, the difficulty in bending the flow path is not increased, without affecting the service life after bending.

In an embodiment of the present invention, the power pump 1 is a piezoelectric pump, which has a power configured to allow for driving at a higher power when a temperature of the heat source is greater than or equal to a set value, and driving at a lower power when the temperature of the heat source is smaller than the set value. Here, the high power may be achieved by improving the frequency of the piezoelectric pump. During actual implementation, the power of the piezoelectric pump may be controlled based on the acquired temperature near the heat source. With the arrangement in such a way, the flow rate can be increased in a short time to achieve rapid cooling, and meanwhile, low-power operation is allowed during disclosure of heat dissipation requirements, thereby achieving the energy-saving effect.

Embodiment II

In a second embodiment of the present invention, different from the mode of changing the flow rate by changing the width of the flow channel 21 in the first embodiment, the cross-sectional area of the flow channel 21 is changed by adding dividing strips in Embodiment II of the present invention. In this embodiment of the present invention, the material, the number of layers and the buffering holes of the heat-dissipating vapor chamber 2 and the configuration of the power pump 1 are the same as those in Embodiment I, which will not be repeated here any more.

Figure 4:
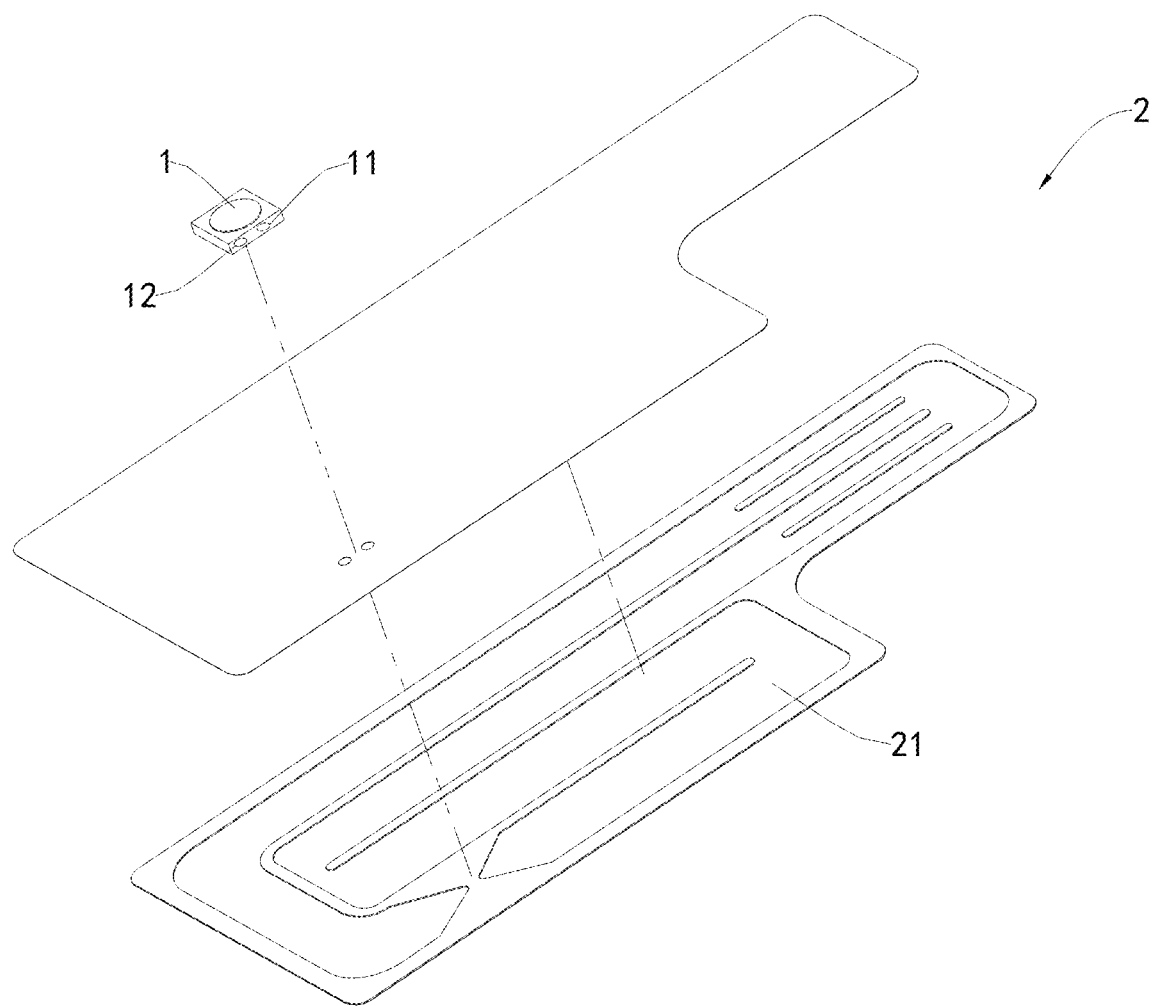
FIG. 4 shows a schematic structural diagram of a heat dissipation apparatus according to Embodiment II of the present invention.
Figure 5:
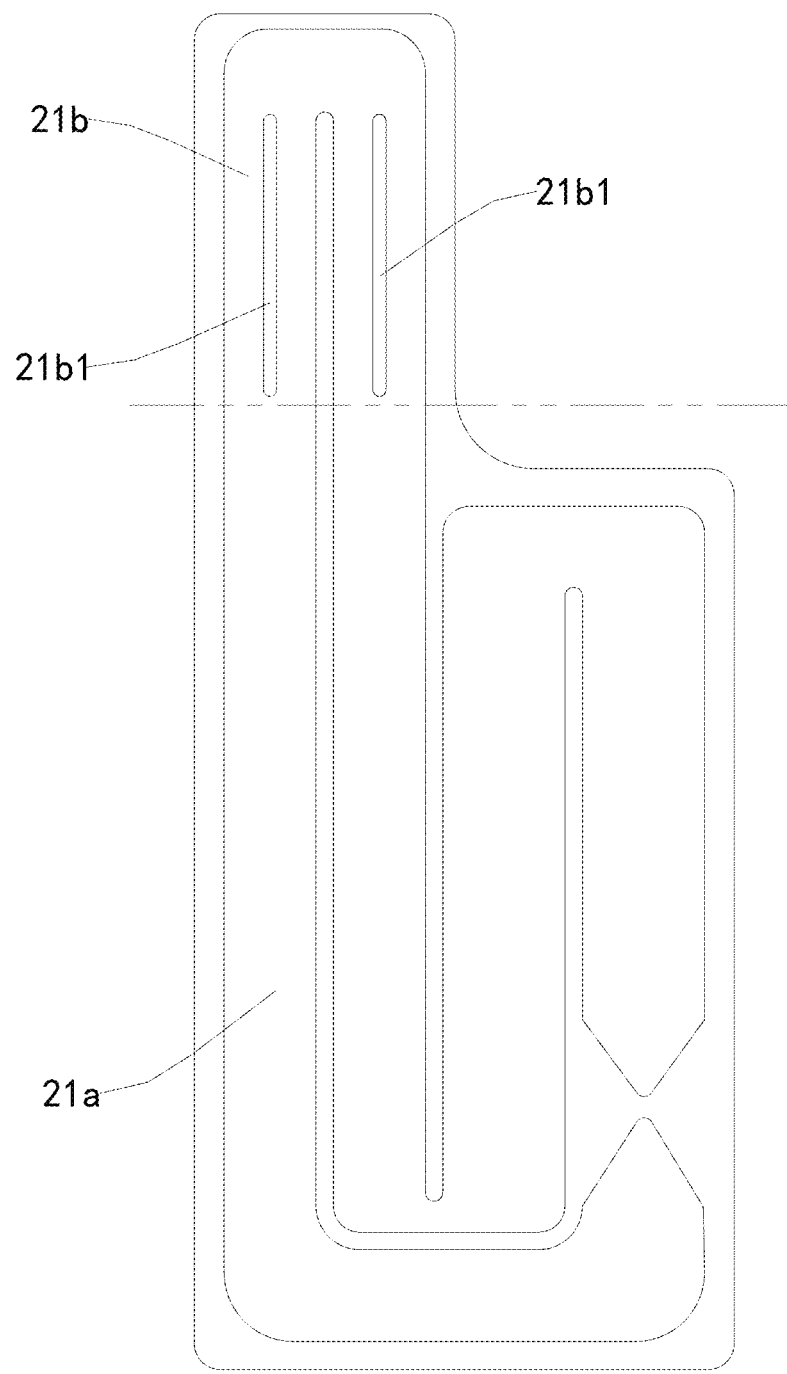
FIG. 5 shows a schematic diagram of a flow path structure in a heat-dissipating vapor chamber according to Embodiment II of the present invention.

Specifically, as shown in FIG. 4 and FIG. 5, in this embodiment of the present invention, the flow channel 21 has dividing strips 21b1 in the rapid flow region 21b along the flow direction of the cooling medium. Here, the dividing strips 21b1 are fixed between the upper region 2a and the lower region 2c by bonding during machining. With such an arrangement, the difficulty in machining the middle region 21b can be reduced; and the dividing strips 21b1 occupy the flow space of the cooling medium in the flow channel 21, such that the cross-section area for effective flowing of the cooling medium in the rapid flow region 21b is reduced, which improves the flow rate of the cooling medium.

Figure 6:
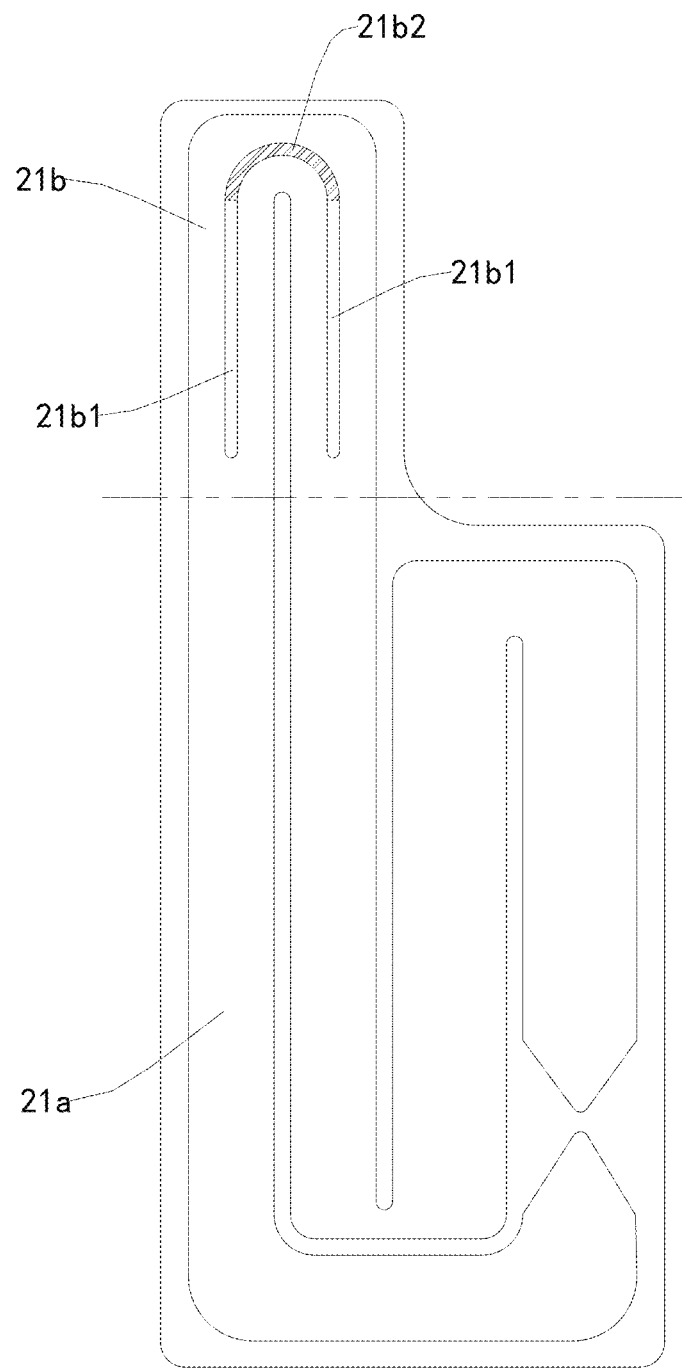
FIG. 6 shows a schematic diagram of the flow path structure in the heat-dissipating vapor chamber according to Embodiment II of the present invention.

Based on the above embodiment, as shown in FIG. 6, the flow channel 21 is tortuously arranged in the rapid flow region 21b, and an arc flow guiding strip 21b2 is further connected between two dividing strips 21b1 between two adjacent tortuous channels. The tortuous arrangement here refers to that the cooling medium flows to the rapid flow region 21b, and the flow direction reverses 180 degrees before the cooling medium flows out, as shown in FIG. 6. With such an arrangement, the contact area with the heat source can be increased to improve the heat dissipation effect. Based on the above embodiment, the arc flow guiding strip 21b2 is arranged to achieve a separation effect in one aspect, and to reduce eddy current and pressure in the flow channel in another aspect.

Figure 7:
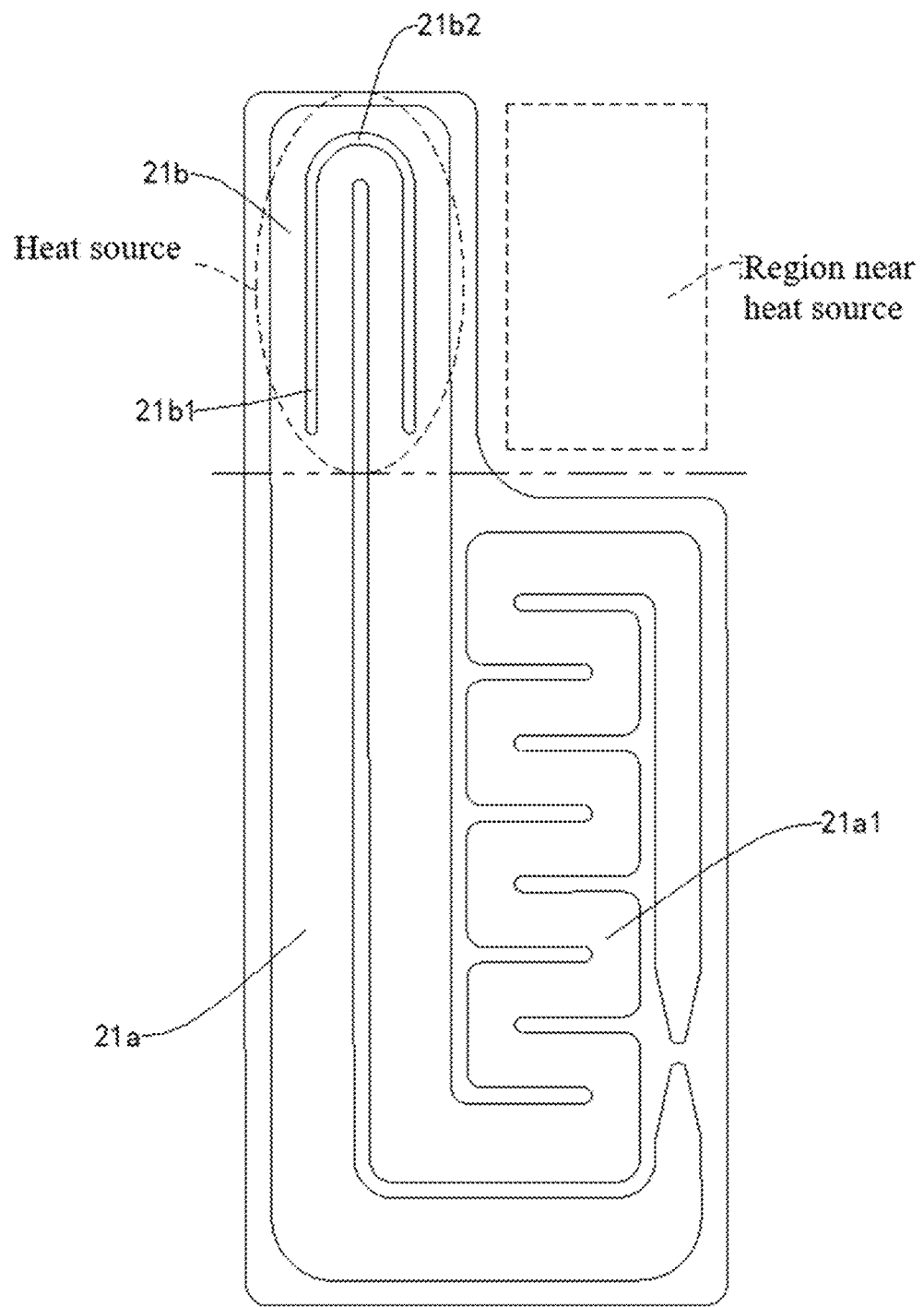
FIG. 7 shows a schematic diagram of an improved flow path structure in the heat-dissipating vapor chamber according to Embodiment II of the present invention.

Based on the above embodiment, in order to further improve the heat dissipating effect of the slow flow region 21a, the portion of the slow flow region 21a extending from the rapid flow region 21b further includes a tortuous channel 21a1, as shown in FIG. 7, in this embodiment of the present invention. With the arrangement of the above tortuous flow channel, the cooling medium flowing from the rapid flow region 21b turns multiple times to increase the flowing length, such that the heat dissipating time of the cooling medium is increased. In addition, in this embodiment of the present invention, in order to reduce the impact of the temperature of the cooling medium itself to the heat source, continuing to refer to FIG. 7, the flow channel 21 passes the heat source only once in a single circulation, the cooling medium flows from the end of the flow channel 21 away from the heat source to the rapid flow region 21b, and after flowing out of the rapid flow region 21b, the cooling medium first flows to the distant end and then flows back to form a circulation. The cooling medium passes the heat source only once, such that the cooling medium heated by the heat source is prevented from affecting the heat source; the cooling medium first flows into the end away from the heat source and then flows out in a direction away from the heat source, such that the cooling medium in each circulation flows into the rapid flow region 21b at the lowest temperature to cool the heat source, and then dissipate the heat as soon as possible, thereby improving the efficiency in cooling the heat source. In this embodiment of the present invention, continuing to refer to FIG. 7, the flow channel 21 is configured to enable the cooling medium to first tortuously flow to get close to the rapid flow region 21b and then flow back to the rapid flow region 21b to form a circulation, after the cooling medium flows out from the rapid flow region 21b to a distant end, in order to further reduce the influence of the cooling medium flowing out from the rapid flow region 21b to the heat source when the cooling medium flows through the region near the heat source. As shown in FIG. 7, in this embodiment of the present invention, getting close to the rapid flow region 21b refers to flowing to a region where the heat source is laterally located, the tortuous flow channel 21 turns back without entering the rectangular dashed box shown in FIG. 7. With such an arrangement, the influence of the temperature of the cooling medium in the back flow to the heat source can be minimized.

Embodiment III

Figure 8:
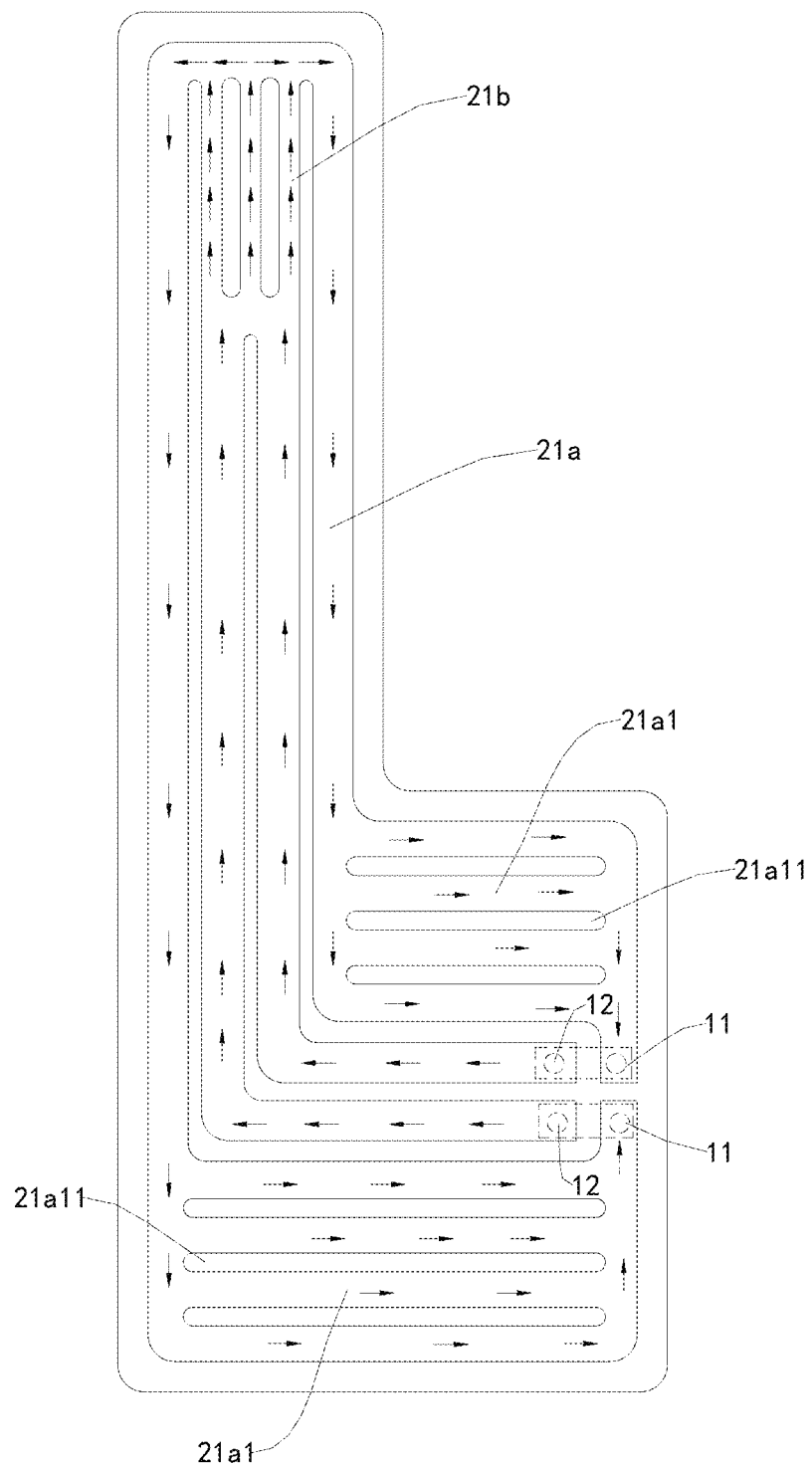
FIG. 8 shows a schematic diagram of a dual-flow path structure according to Embodiment III of the present invention (two power pumps)
Figure 9:
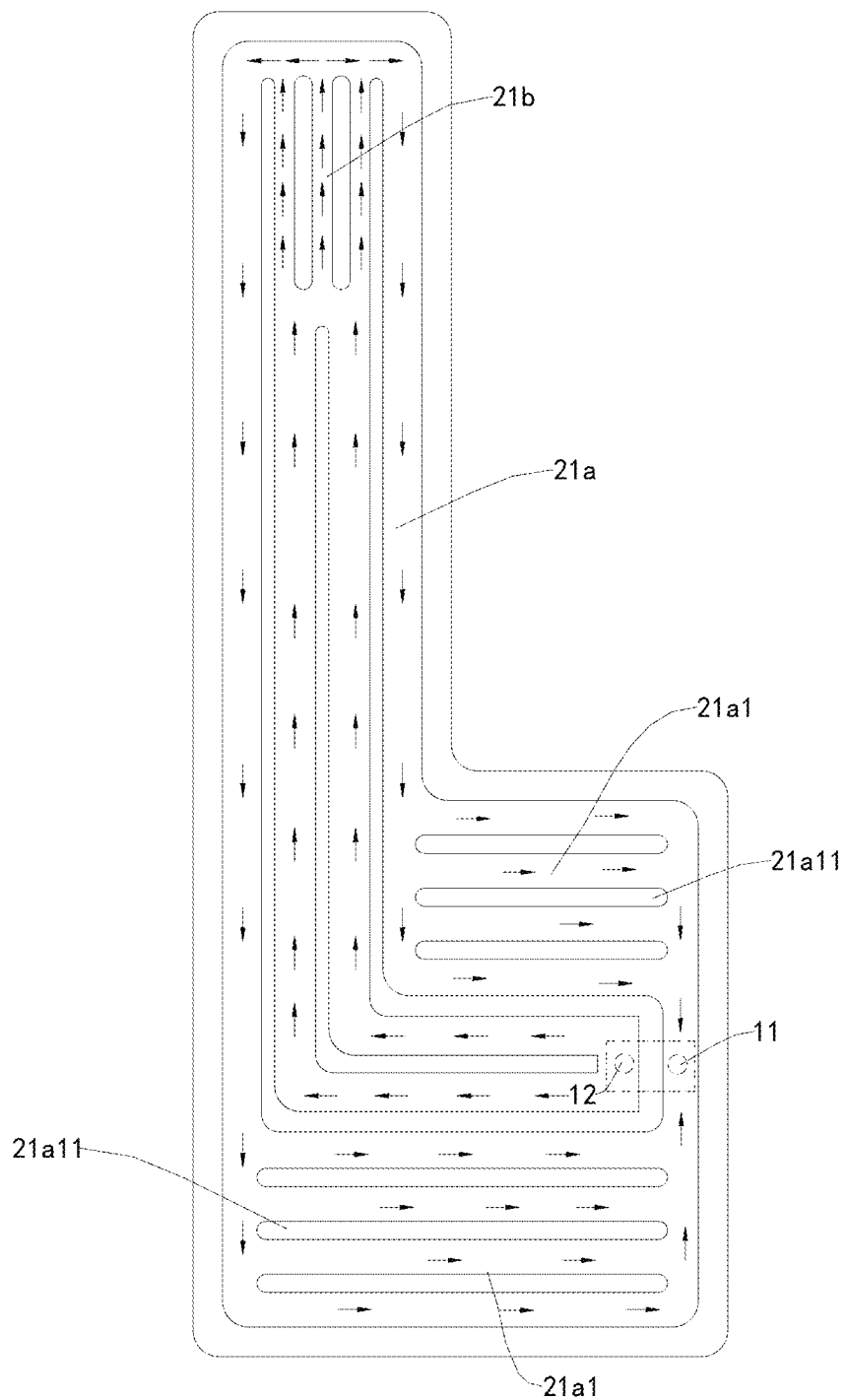
FIG. 9 shows a schematic diagram of the dual-flow path structure according to Embodiment III of the present invention (single power pump)

In a third embodiment of the present invention, the flow channel 21 is improved with dual flow paths. As shown in FIG. 8 and FIG. 9, in this embodiment of the present invention, the flow channel 21 is in a form of dual channels, and the cooling medium is divided into two back flows after passing the heat source. As shown in FIG. 8 and FIG. 9, the cooling medium passes the heat source and then reverses and flows back from two sides. With such an arrangement, the circulating length is reduced, and the back pressure on the cooling medium is reduced, thereby improving the cooling efficiency. Certainly, it should be noted here that, in a third embodiment of the present invention, the rapid flow region 21b may be implemented by means of the dividing strips 21b1 shown in FIG. 8 and FIG. 9, or by changing the width as in Embodiment I.

Based on the above embodiment, in this embodiment of the present invention, continuing to refer to FIG. 8 and FIG. 9, in order to further reduce the back pressure on the cooling medium during flowing, the back flow portion of the slow flow region 21a is further connected to a laminar flow section, which has a cross-sectional area greater than that of the flow channel 21 in the slow flow region 21a. With the arrangement of the laminar flow section, the flowing area of the cooling medium is greatly increased to minimizing the back pressure. In addition, in this embodiment of the present invention, in order to ensure the flow rate at the same time, the laminar flow section is provided with shunting strips 21a11 therein, as shown in FIG. 8 and FIG. 9. In this way, the shunting strips 21a11 are arranged to direct the cooling medium and ensure the flow rate, thereby achieving the optimal heat dissipating effect. Certainly, it should also be noted here that, in a dual-flow channel structural form, two power pumps 1 may be arranged as shown in FIG. 8, or one power pump 1 may be arranged as shown in FIG. 9, and the specific number can be adjusted by those skilled in the art according to actual needs.

Embodiment IV

Figure 10:
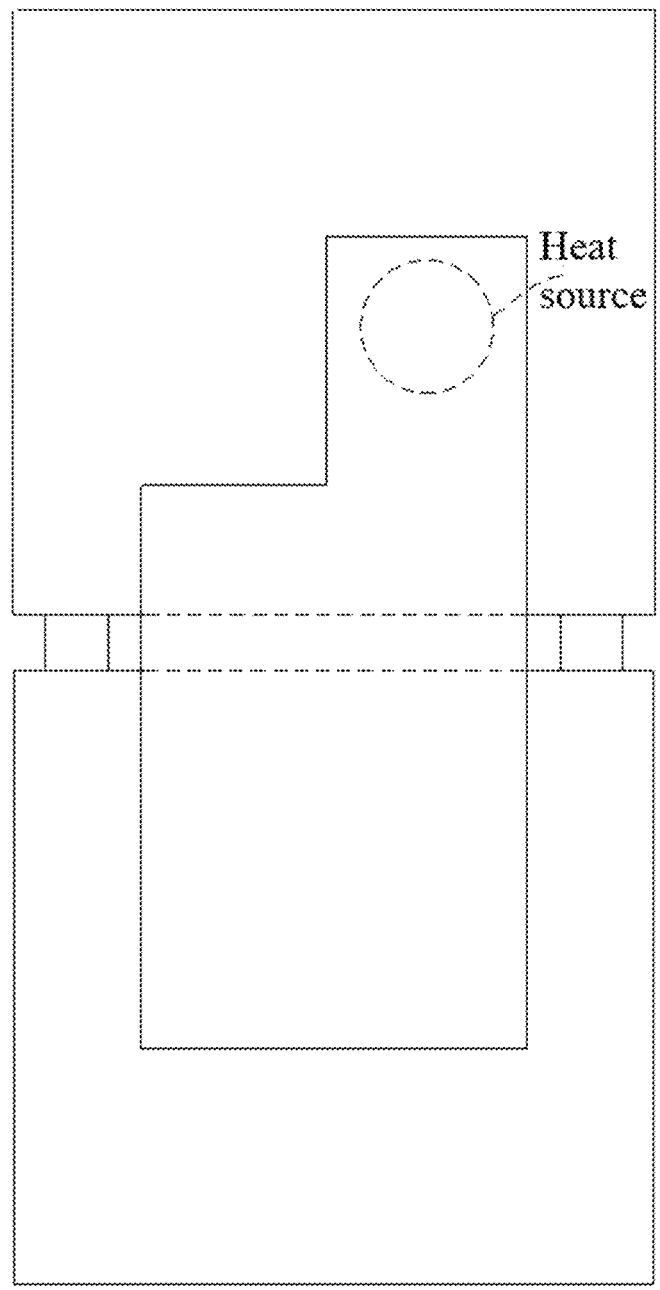
FIG. 10 shows a schematic structural diagram of an electronic device according to Embodiment IV of the present invention.

In this embodiment of the present invention, an electronic device is further disclosed. The electronic device includes a heating component and the heat dissipation apparatus disclosed in any one of the embodiments described above. As shown in FIG. 10, the heat dissipation apparatus in the embodiments of the present invention may be installed in a foldable device, for example, a notebook computer or a foldable mobile phone. Certainly, it should also be noted here that the position of the power pump 1 in the embodiments of the present invention is not limited to the position at the distal end of the heat source, and may be disposed near the heat source, the power pump 1 mainly serves to drive, and its position can be set by those skilled in the art according to actual needs. The specific structural form of the heat-dissipating vapor chamber 2 in the heat dissipation apparatus can be changed according to actual needs. As shown in the drawings, in a case where a camera or other regions to be evaded exist in the vicinity of the heat source, or in case of a rotary shaft of a foldable screen or other functional structural members to be evaded, the flow channel 21 can be improved by fully utilizing other space to ensure the normal use of the rapid flow region 21b and the slow flow region 21a as described above.

Those skilled in the industry should understand that the present invention is not limited by the embodiments described above. The description in the above embodiments and specification only illustrates the principle of the present invention. Without departing from the spirit and scope of the present invention, it is also possible to make a variety of variations and improvements to the present invention. These variations and improvements shall fall within the scope claimed by the present invention. The scope claimed by the present invention is subject to the appended claims and equivalents thereof.

What is claimed is:

1. A heat dissipation apparatus, comprising:
two adjacent power pumps each has an inlet and an outlet, a cooling medium flowing into the respective inlet and being delivered by the respective power pump through the respective outlet; and
a heat-dissipating vapor chamber provided with two flow channels therein, both ends of each flow channel being communicated to the respective outlet and the respective inlet, respectively, to form two circulating cooling paths, wherein the heat-dissipating vapor chamber sequentially comprises an upper region, a middle region and a lower region in a thickness direction thereof;
wherein each flow channel has a slow flow region which is away from a heat source and in which the cooling medium has a lower velocity, the slow flow region is used to dissipate heat rapidly, the flow channel has a rapid flow region which is close to the heat source and in which the cooling medium has a higher velocity, and the rapid flow region is used to rapidly absorb and take away heat; a cross-sectional area of each flow channel at the slow flow region is greater than a cross-sectional area of each flow channel at the rapid flow region; and
wherein the two flow channels include dividing strips in the rapid flow region and in slow flow region along a flow direction of the cooling medium,
wherein the two flow channels are merged into one flow section, in order for the cooling medium in each flow channel to be mixed with each other, and then divided, in the rapid flow region, into three adjacent flow sections via the dividing strips forming two back flows after passing the heat source; wherein each of the two back flows is divided, in slow flow region, into four adjacent flow sections via the dividing strips;
wherein the dividing strips are fixed between the upper region and the lower region by bonding during machining.

2. The heat dissipation apparatus according to claim 1, wherein each flow channel passes the heat source only once in a single circulation, the cooling medium in each flow channel flows from an end of the flow channel away from the heat source to the rapid flow region, and after flowing out of the rapid flow region, the cooling medium first flows to the distant end and then flows back to form a circulation.

3. The heat dissipation apparatus according to claim 1, wherein the heat-dissipating vapor chamber is made of a flexible material, and is provided with buffering through holes in a folded region and around each flow channel.

4. The heat dissipation apparatus according to claim 1, wherein each flow channel is disposed on the middle region, the middle region comprises at least one layer of thin-film material, and the upper region and the lower region are used to seal the cooling medium in the middle region and are each made of a metallic thin sheet or a thin-film material.

5. The heat dissipation apparatus according to claim 4, wherein the thin-film material is made of graphene, polytetrafluoroethylene, modified PI, PEN or PET, and the metallic thin sheet is made of a steel foil, aluminum foil or a copper foil.

6. The heat dissipation apparatus according to claim 1 wherein each of the two power pump is a piezoelectric pump, which has a power configured to allow for driving at a higher power when a temperature of the heat source is greater than or equal to a set value, and driving at a lower power when the temperature of the heat source is smaller than the set value.

7. An electronic device,
comprising:
the heat dissipation apparatus according to claim 1; and
the heat source.

* * * * *